United States Patent
Krenz et al.

(10) Patent No.: US 9,664,723 B2
(45) Date of Patent: May 30, 2017

(54) SYSTEMS AND METHODS FOR ARC DETECTION

(71) Applicant: Hamilton Sundstrand Corporation, Charlotte, NC (US)

(72) Inventors: Michael Krenz, Roscoe, IL (US); Carl A. Wagner, Beloit, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 51 days.

(21) Appl. No.: 14/605,207

(22) Filed: Jan. 26, 2015

(65) Prior Publication Data

US 2016/0216305 A1 Jul. 28, 2016

(51) Int. Cl.
| | |
|---|---|
| *G01R 31/02* | (2006.01) |
| *H02H 1/00* | (2006.01) |
| *G01R 17/02* | (2006.01) |
| *G01R 23/02* | (2006.01) |
| *H02H 3/28* | (2006.01) |
| *H02H 3/52* | (2006.01) |

(52) U.S. Cl.
CPC ........... *G01R 31/025* (2013.01); *G01R 17/02* (2013.01); *G01R 23/02* (2013.01); *H02H 1/0015* (2013.01); *G01R 31/02* (2013.01); *H02H 3/28* (2013.01); *H02H 3/52* (2013.01)

(58) Field of Classification Search
CPC ...... G01R 31/025; G01R 17/02; G01R 23/02; G01R 31/02; G01R 31/08
See application file for complete search history.

(56) References Cited

U.S. PATENT DOCUMENTS

| | | | |
|---|---|---|---|
| 8,564,307 B2* | 10/2013 | Kolker | G01R 31/025 324/536 |
| 8,599,523 B1 | 12/2013 | Ostrovsky et al. | |
| 2008/0204949 A1 | 8/2008 | Zhou et al. | |
| 2011/0141644 A1 | 6/2011 | Hastings et al. | |
| 2013/0128396 A1* | 5/2013 | Danesh | G01R 19/00 361/45 |

OTHER PUBLICATIONS

European Search Report from European Patent Office dated Jun. 8, 2016 for Application No. EP 16 15 2781.

* cited by examiner

*Primary Examiner* — Julian Huffman
*Assistant Examiner* — Michael Konczal
(74) *Attorney, Agent, or Firm* — Locke Lord LLP; Scott D. Wofsy; Christopher J. Cillié

(57) ABSTRACT

An arc fault detection system includes a first current sensor, a second current sensor, a band-pass filter, and a comparator module. The first current sensor, the second current sensor, and the comparator module are each connected to the comparator module by direct leads for biasing a current differential between the first current sensor and the second current sensor using a bias calculated from a frequency component indicative of arc events received from the frequency selector.

14 Claims, 3 Drawing Sheets

SYSTEMS AND METHODS FOR ARC DETECTION

BACKGROUND OF THE INVENTION

1. Field of the Invention

The present disclosure relates to electrical systems, and more particularly to monitoring and protecting electrical systems from arc fault events.

2. Description of Related Art

Power distribution systems commonly include devices like circuit breakers and arc fault circuit interrupters (AFCI) to for protecting system components. Circuit breakers typically de-energize circuits when current exceeds a predetermined overcurrent limit for the circuit for a predetermined period of time. AFCIs generally de-energize circuits when current flow varies within the overcurrent limit of the circuit. Parallel and series arc faults can cause such current flow variation in the circuit. Some circuit protection devices include both circuit breakers and AFCI devices.

Arcing is an electrical phenomenon wherein a potential difference induces current flow across a material typically considered to be a non-conductor, like an air gap. Parallel arc faults generally involve current flow between a conductor and a ground potential, such as when an insulation defect allows current to short between the conductor and an adjacent ground potential. Series arc faults are typically within a conductor, such as when a break within a conductor presents relatively poor electrical connection that current flow periodically traverses through arc events. AFCIs are generally configured to distinguish between arc events and other sources of periodic variation in current flow through a conductor. AFCIs generally distinguish arc events from innocuous periodic variations in current flow for purposes of limiting nuisance trips.

Such conventional methods and systems have generally been considered satisfactory for their intended purpose. However, there is still a need in the art for improved arc fault detection devices. The present disclosure provides a solution for this need.

SUMMARY OF THE INVENTION

An arc fault detection system includes a first current sensor, a second current sensor, a frequency measurement device, and a comparator module. The first and second current sensors and frequency measurement device are each connected to the comparator module by direct leads for biasing current differential between the first current sensor and the second current sensor using a bias calculated from a frequency component indicative of arc events provided by the frequency measurement device.

In certain embodiments, the current sensors can be inductively coupled to a conductor. A power source can be connected to a power source end of the conductor. A load can be connected to a load end of the conductor. The first current sensor can be inductively coupled to the power source end of the conductor and the second current sensor can be inductively coupled to the load end of the conductor.

In accordance with certain embodiments, the frequency measurement device can be inductively coupled to the conductor between the first and second current sensors. The frequency measurement device can include a band-pass filter with a band-pass range indicative of arc events, such as between about 40 and 50 kilohertz. A rectifier can be connected to the band-pass filter for rectifying the frequency signal provided by the band-pass filter to provide a bias signal. Direct leads can connect each of the sensors and the frequency measurement device with a comparator for biasing differential current value between the first and second sensors using the frequency signal.

It is also contemplated that, in accordance with certain embodiments, the system can include a processor and a memory having instructions recorded on the memory that, when read by the processor, cause the processor to undertake certain actions. The memory can include a Fast Fourier Transform module or band-pass filter network for selecting and measuring a signal with a frequency component indicative of arc events associated with the conductor in current received form the frequency measurement device. A bias generator module included in the memory can convert the frequency component indicative of arc events into a bias. A differential current value biasing module can bias differential current value measurements from the current sensors. The memory can also include an increment rate selection module for incrementing a fault count at a fast rate, a slow rate, or holding the fault count unchanged based on the biased differential current value.

An arc detection method includes determining a differential current value at first and second locations on a conductor, determining magnitude of a frequency component of current traversing the conductor indicative of arc events associated with the conductor, calculating a bias using the magnitude of the frequency component, biasing the differential current value using the bias, and determining whether to de-energize the conductor using the biased differential current value.

In embodiments, the method can include incrementing a fault count when the biased differential current value exceeds a first predetermined value. The method can also include decrementing the fault count when the biased differential current value is below a second predetermined value. The second predetermined value can be less than the first predetermined value. The fault count can be held constant when the biased differential current value is between the first and second predetermined values. It is also contemplated that the method can include de-energizing the conductor when the fault count exceed a fault count trip limit, energizing the conductor upon receipt of a reset command, and decrementing the fault count upon receipt of the reset command.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
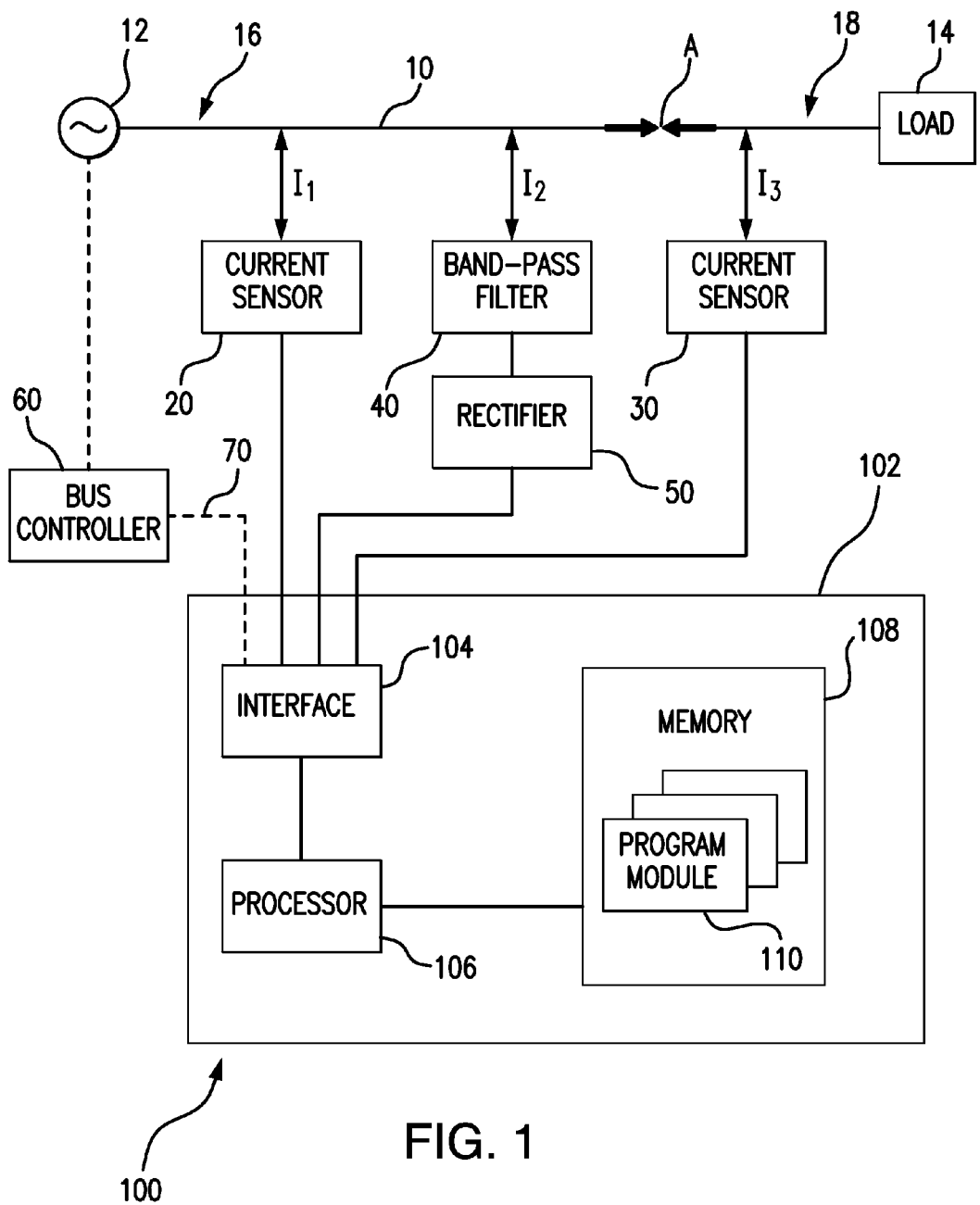
FIG. 1 is a schematic view of an exemplary embodiment of an arc detection system constructed in accordance with the present disclosure, showing the current sensor and frequency measurement devices.

Reference will now be made to the drawings wherein like reference numerals identify similar structural features or aspects of the subject disclosure. For purposes of explanation and illustration, and not limitation, a partial view of an exemplary embodiment of the arc detection system in accordance with the disclosure is shown in FIG. 1 and is designated generally by reference character 100. Other embodiments of arc detection systems and methods of arc detection in accordance with the disclosure, or aspects thereof, are provided in FIGS. 2-3, as will be described. The systems and methods described herein can be used for detecting arc fault events, such as series and/or parallel arc fault events in aircraft power distribution systems.

As shown in FIG. 1, a conductor 10 electrically connects a power source 12 to a load 14. Conductor 10 includes a protected length extending between a source end 16 and a load end 18 of conductor 10. Conductor 10 connects to power source 12 at source end 16. Conductor 10 connects to load 14 at load end 18. Power source 12 can be a direct current (DC) power source, such as a 12-volt or 24-volt DC power source. Power source 12 may also be an alternating current (AC) power source, such as one phase of a three-phase to a 400-hertz AC power source. Conductor 10 also has an arc fault location disposed along the length of conductor 10. Arc events occurring at the arc fault location are intermittent, and can be in the form of series arc events and/or parallel arc events.

Arc detection system 100 includes a first current sensor 20, a second current sensor 30, and a band-pass filter 40. First current sensor 20 and second current sensor 30 are both coupled to conductor 10 at separate conductor locations. As illustrated in FIG. 1, a first inductive coupling $I_1$ couples first current sensor 20 to a source end 16 of conductor 10 and a second inductive coupling $I_2$ couples second current sensor 30 to a load end 18 of conductor 10, defining therebetween a protected length of conductor 10. A third inductive coupling $I_3$ couples band-pass filter 40 to conductor 10 along the protected length of conductor 10, i.e. at a location between coupling locations of first current sensor 20 and second current sensor 30. The arc fault location can be anywhere along the length of conductor, and is illustrated in FIG. 1 at a location between second current sensor 30 and load end 18 of conductor 10. A rectifier 50 connects to band-pass filter 40 for converting the signal received therefrom.

Arc detection system 100 also includes a comparator 102. Comparator 102 connects to first current sensor 20, band-pass filter 40 through rectifier 50, and second current sensor 30 through a communications bus 70. First current sensor 20 and second current sensor 30 are both configured and adapted for providing measurements of current from separate locations on conductor 10 to comparator 102. Band-pass filter 40 is additionally configured and adapted to provide current measurements of signals within a predetermined current frequency range. In embodiments, the predetermined frequency range is between about 40 kilohertz and about 50 kilohertz. A detected signal representing the amplitude of the current in this frequency range can be indicative of arc events at arc fault locations along conductor 10.

Rectifier 50 is configured and adapted to receive AC current from band-pass filter 40 within the predetermined frequency range, rectify the received AC current into DC current, and provide the DC current to comparator 102. Magnitude of DC current flow received from rectifier 50 by comparator 102 that varies in a way that is indicative of arcing along conductor 10. In particular, relative to current flow at the fundamental frequency of current flow through conductor 10, DC current flow having a magnitude greater than about 2% of current flow in the fundamental frequency through conductor 10 can be indicative that arcing is likely along conductor 10.

Comparator 102 includes an interface 104, a processor 106, and a memory 108 having one or more program modules 110. Interface 104 is connected to communications bus 70 and to processor 106. Processor 106 in turn is connected to and communicative with memory 108 such that it can read instructions recorded on memory 108. The instructions recorded on memory 108 include program modules 110 that, when read by processor 106, cause processor 106 to undertake certain actions.

Interface 104 preferably includes an input/output device that is communicative with a bus controller 60 configured for taking circuit protection measures in the event that arcing is detected. For example, in the event that the trip limit is exceeded, the bus controller de-energize conductor 10. User interface 104 can also receive a reset command, in which can one or more program modules 110 can set the fault count to zero and re-energize conductor 10.

Processor 106 can be an electronic device with logic circuitry that responds to and executes instructions. Memory 108 can be a computer-readable medium encoded with a computer program. In this regard, memory 108 stores data and instructions readable and executable by processor 106 for controlling the operation of processor 106. Memory 108 may be implemented in a random access memory (RAM), a hard drive, a read only memory (ROM), or a combination thereof having recorded thereon program modules 110.

Program module 110 contains instructions for controlling processor 106 to execute the methods described herein. For example, under control of program module 110, processor 106 performs the processes described for the processor of arc detection system 100. It is to be appreciated that the term "module" is used herein to denote a functional operation that may be embodied either as a stand-alone component or as an integrated configuration of a plurality of sub-ordinate components. Thus, program module 110 may be implemented as a single module or as a plurality of modules that operate in cooperation with one another. Moreover, although program module 110 is described herein as being installed in memory 108, and therefore being implemented in software, it could be implemented in any of hardware (e.g., electronic circuitry), firmware, software, or a combination thereof. Examples of actions undertaken by processor 106 by program modules 110 include, for example, (a) receive current measurements from first current sensor 20, second current sensor 30, and band-pass filter 40, (b) determine magnitude of current flows with frequencies within a frequency band indicative of arcing along a protected length of conductor 10, (c) determine a bias value based on the determined magnitude, and (d) biasing the differential of the received first and second current sensor measurements, and (e) determining whether to de-energize the conductor based on the biased current differential.

Processor 106 outputs, to interface 104, a result of an execution of the methods described herein. Alternatively, processor 106 could direct the output to a remote device, e.g., bus controller 60, via a suitable network. It is also to be appreciated that while program module 110 is indicated as already loaded into memory 108, it may be configured on a storage medium for subsequent loading into memory 108. The storage medium is also a computer-readable medium encoded with a computer program, and can be any conventional storage medium that stores program module thereon in tangible form. Examples of storage medium include a floppy disk, a compact disk, a magnetic tape, a read only memory, an optical storage media, universal serial bus (USB) flash drive, a solid-state storage (SSD), a compact flash card, or a digital versatile disc. Alternatively, the storage medium can be a random access memory, or other type of electronic storage, located on a remote storage system and coupled to comparator 102 via a suitable network.

It is further to be appreciated that although the systems and methods described herein can be implemented in software, they could be implemented in any of hardware (e.g., electronic circuitry), firmware, software, or a combination thereof.

Figure 2:
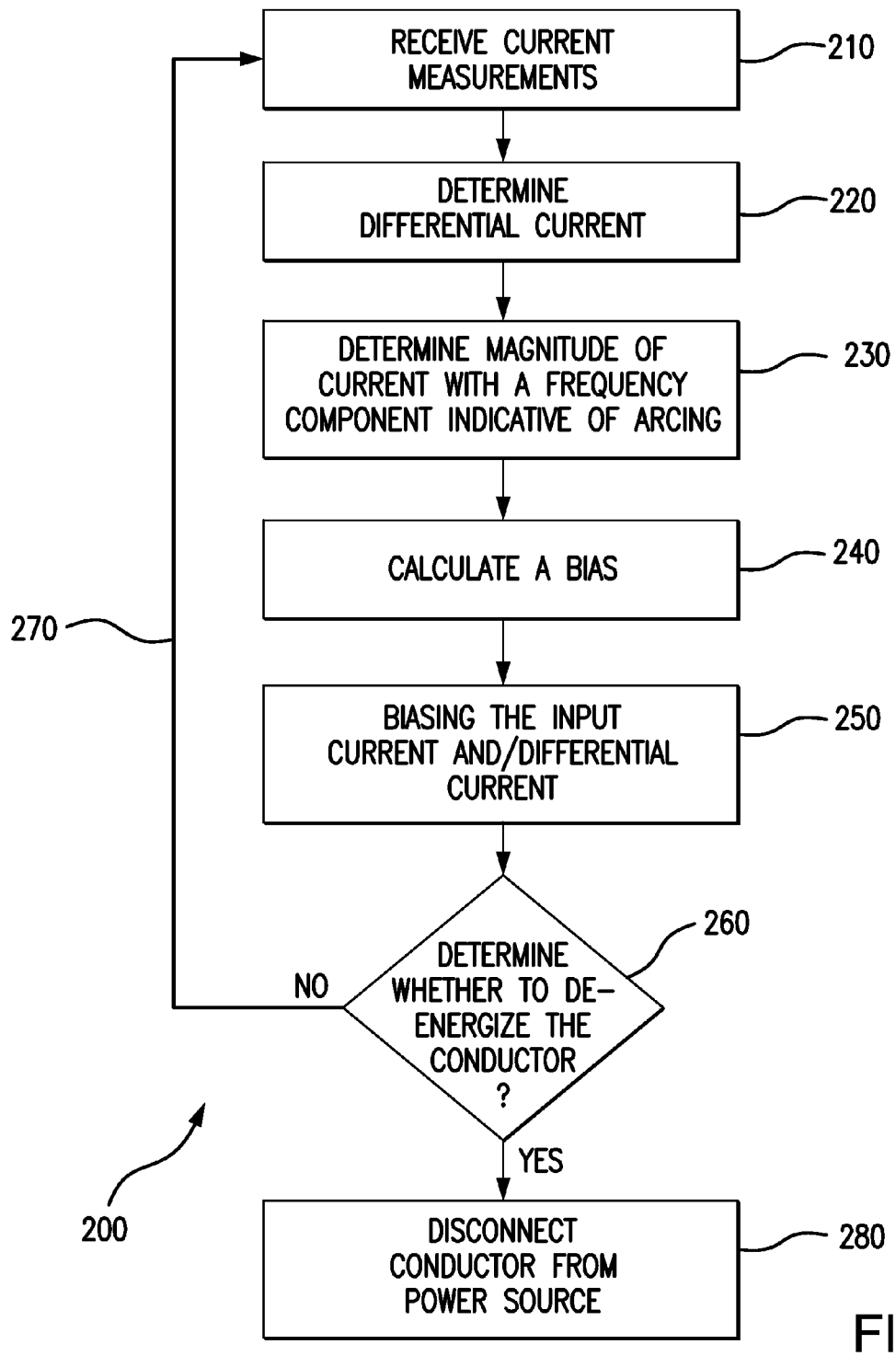
FIG. 2 is a block diagram of an arc detection method, showing receipt of input current measurements, output current measurements, and current within a frequency band indicative of arc events.

With reference to FIG. 2, an arc detection method 200 is shown. Method 200 includes receiving current measurements from current sensors inductively coupled to a conductor, as shown by box 210. Method 200 also includes determining a differential current value between first and second locations on a conductor, as shown by box 220. Method 200 further includes determining magnitude of a frequency component of current traversing the conductor indicative of arc events associated with the conductor, as shown by box 230. Based on magnitude of the frequency component indicative of arcing, a bias is calculated, as shown by box 240. The bias is added to either or both the current measurement of the first sensor (i.e. the input current measurement) and the difference between the first and second current measurements, as shown with both 250. Based on the biased differential, a determination is made in box 260 as to whether to disconnect the conductor from the power source, indicated by box 280, or leave the conductor in an energized state. In the event that it is determined to lead the conductor in an energized state, monitoring of the conductor can continue, as indicated by arrow 270.

Figure 3:
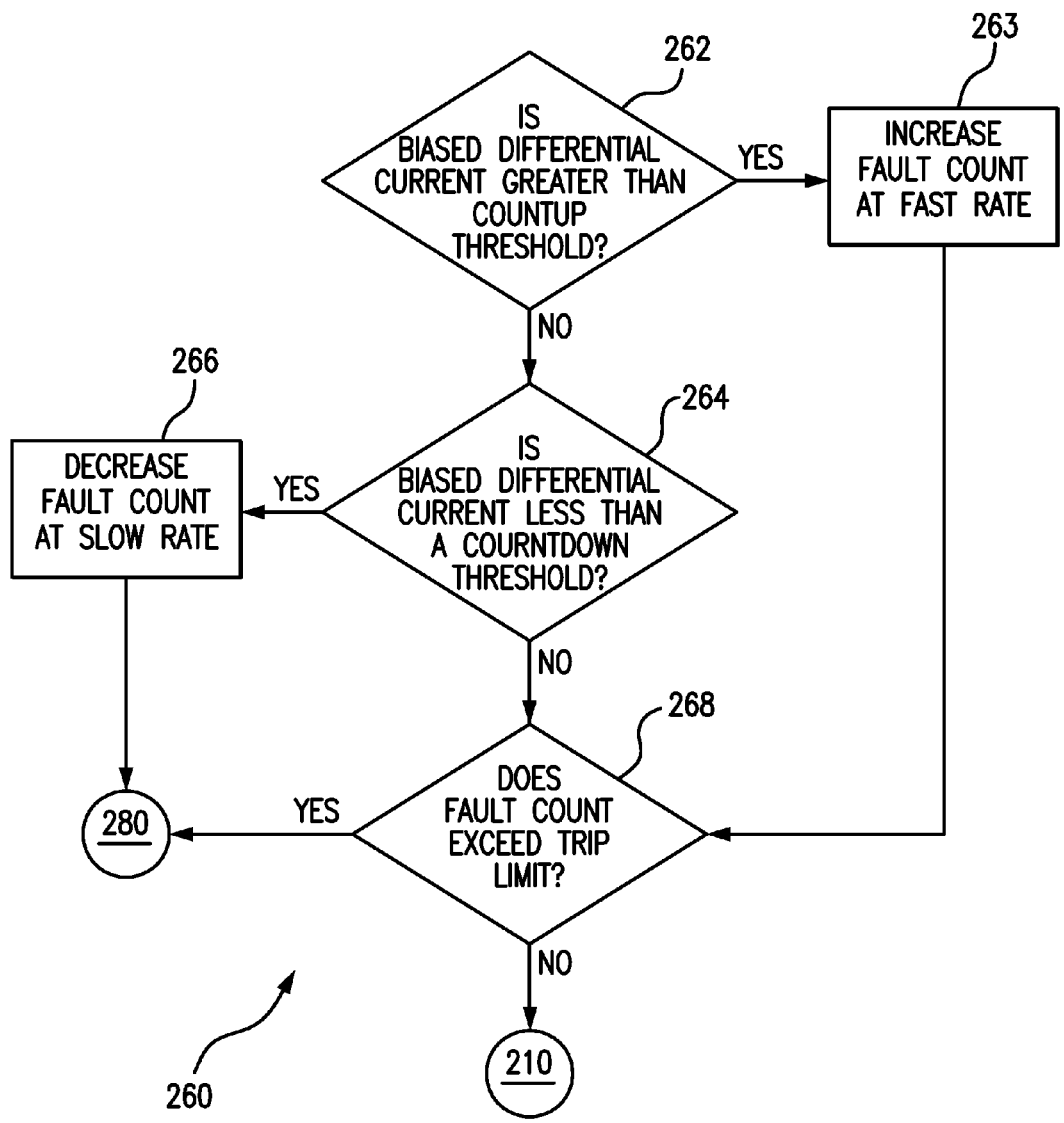
FIG. 3 is a block diagram of an embodiment of an arc detection method, showing operations for incrementing a fault count associated with a protected conductor at different rates based on the current measurements within a frequency band indicative of arc events.

With reference to FIG. 3, an embodiment of method 200 is shown where a fault counter is employed to weight or de-weight a given indication of arcing based on past indications of arcing on the conductor. In this respect, method 200 can additionally include determining whether the biased differential current value is greater than a countup threshold, as indicated with box 262. In the event that the biased differential current value does exceed the countup threshold, the fault count is increased at a fast rate, as indicated by box 263, and the fault compared against a fault count trip limit, as indicated with box 268. In the event that biased differential current value does not exceed the countup threshold, a determination is made in box 264 as to whether the differential current value is below a countdown threshold. In the event that biased differential current value is below the countdown threshold, the fault count is reduces (or held at zero), as indicated with box 266. In the event that the biased differential current value is not less that the countdown threshold, the fault count in increment, and determination is made whether the fault count exceed the trip limit, as indicated by box 268. This methodology can reduce nuisance trips as the fault count can increase or decrease, based on the arc fault indicia aggregated continuously in the fault count.

Some power distribution systems include a power converter and a power distribution bus. The power converter receives power, converts the received power to a voltage and frequency suitable for power-consuming devices, and provides the power to the devices through the conductors associated with the power distribution bus. Since low voltage power distribution systems generally require heavier gauge wires and connectors than high voltage power distribution systems, applications such as aircraft power systems employ high voltage power distribution systems for purposes of limiting the weight associated with wires and connectors included in the power distribution system. Such high voltage power distribution systems require relatively rapid and accurate arc detection due the potential damage that can occur when arcing develops, such as when wire within a conductor develops a break or a lug coupling a conductor end within a distribution panels becomes loose, such as to vibration for example. Operation at high altitude and/or low air density environments can aggravate otherwise latent arc conditions in such power distribution systems.

In embodiments described above, the differential between current measurements on a protected conductor segment is used in conjunction with output from a band-pass filter bracketing characteristic frequencies of intermittent arc events. In certain embodiments, the output of the band-pass filter is rectified and added to the source current measurement. The summed band-pass filter rectified output and source current measurement is compared to a current measurement acquired from the load end of the protected conductor segment, and if the sum exceeds the load end current measurement by a predetermined threshold valve (characteristic of a given application), circuit protection is invoked. As will be appreciated by those skilled in the art in view of the present disclosure, circuit protection can include but is not limited to opening the circuit, current limiting the circuit, load shedding, or any other suitable circuit protection technique.

Some circuit protection devices like electrical contactors are designed to arc during opening for purposes of cleaning the contacts. In embodiments described herein, arc detection systems and methods include a circuit interruption algorithm that can detect intentional arcs events. In certain embodiments, the arc detection systems and methods can "reset" the algorithm after the circuit switching has completed and settled in event that an arc signature is not present in current traversing the protected conductor.

Rapid incrementing of the fault count can allow for detection of real, sustained or repeated arcs events, enable isolation of the protected conductor. Decrementing of the fault count can allow for detection and isolation quickly enough when they occur while preventing intentional arc events from causing nuisance trips of circuit protection. As will be appreciated, the ratio of incrementing and decrementing can vary as appropriate for a given application.

The systems and methods of the present disclosure, as described above and shown in the drawings, provide for power systems with superior properties including improved reliability. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. An arc fault detection system, comprising:
first and second current sensors;

a comparator module connected to the first and second current sensors; and a band-pass filter connected to the comparator module, wherein direct leads connect the sensors and the band-pass filter to the comparator module for biasing a current differential between the sensors using a bias calculated from a frequency component provided by a frequency selection module indicative of arc events, wherein the first sensor is inductively coupled to a power source end of a conductor, wherein the second sensor is inductively coupled to a load end of the conductor, and wherein the band-pass filter is inductively coupled to the conductor between the first and second sensors.

2. A system as recited in claim 1, wherein the band-pass filter includes a Fast Fourier Transform module.

3. A system as recited in claim 2, wherein the frequency selection module includes a band-pass filter, and further including a rectifier connected between the comparator module and the band-pass filter.

4. A system as recited in claim 1, wherein the band-pass filter has a band-pass frequency range of between about 40 and 50 kilohertz.

5. A system as recited in claim 1, further including:
a processor; and
a memory connected with the processor, wherein the memory has instructions recorded thereon that, when read by the processor, cause the processor to:
determine a differential current value using current measurements from the first and second sensors;
determine magnitude of a frequency component indicative of arc events associated with the conductor;
calculate a bias using the magnitude of the frequency component;
bias the differential current value using the bias; and
determine whether to de-energize a conductor using the biased differential current value.

6. A system as recited in claim 5, wherein the instructions recorded on the memory further cause the processor to:
increment a fault count when the biased differential current value exceeds a first predetermined value; and
decrement the fault count when the biased differential current value is below a second predetermined value, wherein the first predetermined value is greater than the second predetermined value.

7. A system as recited in claim 6, wherein the instructions further cause the processor to hold the fault count constant when the biased differential current value is between the first and second predetermined values.

8. A system as recited in claim 6, wherein the instructions further cause the processor to:

de-energize the conductor when the fault count exceed a fault count trip limit;
energize the conductor upon receipt of a reset command; and
decrement the fault count upon receipt of the reset command.

9. An arc detection method, comprising:
inductively coupling a first sensor to a power source end of a conductor;
inductively coupling a second sensor to a load end of the conductor;
inductively coupling a band pass filter to the conductor between the first and second sensors;
determining a differential current value based on output from the first sensor and output from the second sensor;
determining magnitude of a frequency component of current traversing the conductor based on output form the band pass filter, wherein the frequency component is indicative of arc events associated with the conductor;
calculating a bias using the magnitude of the frequency component;
biasing the differential current value using the bias; and
determining whether to de-energize the conductor using the biased differential current value.

10. A method as recited in claim 9, wherein determining the magnitude of the frequency component includes using a Fast Fourier Transform module or a band-pass filter.

11. A method as recited in claim 10, wherein the frequency component is between about 40 and 50 kilohertz.

12. A method as recited in claim 9, further including:
incrementing a fault count when the biased differential current value exceeds a first predetermined value; and
decrementing the fault count when the biased differential current value is below a second predetermined value, wherein the first predetermined value is greater than the second predetermined value.

13. A method as recited in claim 12, further including holding the fault count constant when the biased differential current value is between the first and second predetermined values.

14. A method as recited in claim 12, further including:
de-energizing the conductor when the fault count exceeds a fault count trip limit;
energizing the conductor upon receipt of a reset command; and
decrementing the fault count upon receipt of the reset command.

* * * * *